United States Patent [19]

Kousai et al.

[11] Patent Number: 5,744,824
[45] Date of Patent: Apr. 28, 1998

[54] SEMICONDUCTOR DEVICE METHOD FOR PRODUCING THE SAME AND LIQUID CRYSTAL DISPLAY INCLUDING THE SAME

[75] Inventors: Takamasa Kousai, Tenri; Naoki Makita, Nara; Toru Takayama, Yokohama, all of Japan

[73] Assignee: Sharp Kabushiki Kaisha, Osaka, Japan

[21] Appl. No.: 863,272

[22] Filed: May 27, 1997

Related U.S. Application Data

[63] Continuation of Ser. No. 460,203, Jun. 2, 1995, abandoned.

[30] Foreign Application Priority Data

Jun. 15, 1994 [JP] Japan .................. 6-132973

[51] Int. Cl.⁶ .................. H01L 29/04; H01L 31/036; H01L 29/12

[52] U.S. Cl. .................. 257/74; 257/72; 257/64; 257/65

[58] Field of Search .................. 257/49, 64, 65, 257/66, 70, 71, 72, 74, 75

[56] References Cited

U.S. PATENT DOCUMENTS

| | | | |
|---|---|---|---|
| 5,341,012 | 8/1994 | Misawa et al. | 257/351 |
| 5,403,772 | 4/1995 | Zhang et al. | 437/101 |
| 5,426,064 | 6/1995 | Zhang et al. | 437/40 |
| 5,481,121 | 1/1996 | Zhang et al. | 257/64 |
| 5,488,000 | 1/1996 | Zhang et al. | 437/21 |
| 5,501,989 | 3/1996 | Takayama et al. | 437/21 |
| 5,569,610 | 10/1996 | Zhang et al. | |

FOREIGN PATENT DOCUMENTS

| | | |
|---|---|---|
| 2-61032 | 12/1990 | Japan . |
| 3-4564 | 1/1991 | Japan . |
| 3-291972 | 12/1991 | Japan . |
| 4-245482 | 9/1992 | Japan . |
| 5-55142 | 3/1993 | Japan . |
| 5-136048 | 6/1993 | Japan . |
| 5-218156 | 8/1993 | Japan . |
| 5-243575 | 9/1993 | Japan . |
| 6-244103 | 9/1994 | Japan . |
| 6-244104 | 9/1994 | Japan . |

*Primary Examiner*—Stephen Meier
*Attorney, Agent, or Firm*—Nixon & Vanderhye, P.C.

[57] ABSTRACT

A liquid crystal display device including: a display section including a liquid crystal layer; a pair of substrates interposing the liquid crystal layer; a plurality of pixel electrodes located in a matrix on one of the pair of substrates; a plurality of first thin film transistors respectively connected to the plurality of pixel electrodes; and a peripheral driving circuit located for driving the display section, the peripheral driving circuit being located on the substrate on which the first thin film transistors are located and having a second thin film transistor. Each of the first thin film transistors includes a first channel layer formed of a first crystalline silicon layer, and the second thin film transistor includes a second channel layer formed of a second crystalline silicon layer having a higher mobility than the mobility of the first crystalline silicon layer. The second crystalline silicon layer includes a catalytic element for promoting crystallization.

11 Claims, 10 Drawing Sheets

SEMICONDUCTOR DEVICE METHOD FOR PRODUCING THE SAME AND LIQUID CRYSTAL DISPLAY INCLUDING THE SAME

This is a continuation of application Ser. No. 08/460,203, filed Jun. 2, 1995, now abandoned.

BACKGROUND OF THE INVENTION

1. Field of the Invention

The present invention relates to a semiconductor device including two types of thin film transistors having two different properties from each other and a method for producing the same. The present invention also relates to an active matrix liquid crystal display including transistors for turning on and off a plurality of pixel electrodes provided in a matrix on an insulation substrate formed of glass of the like. In particular, the present invention relates to a driver monolithic type active matrix liquid crystal display including a display section having the pixel electrodes and the transistors and also including a peripheral driving circuit having transistors for driving the display section,

2. Description of the Related Art

As liquid crystal displays of the above-described type, active matrix liquid crystal displays (hereinafter, referred to as "LCDs") including a plurality of thin film transistors (hereinafter, referred to as "TFTs") acting as switching devices for a plurality of pixel electrodes are known. Such LCDs are in a wide use today for TVs, data processing apparatuses, and measuring apparatuses.

In general, a TFT uses a thin semiconductor film formed of silicon as an active layer thereof. Such a thin semiconductor film is mainly formed of amorphous silicon or crystalline silicon. A semiconductor film formed of amorphous silicon, which can be produced relatively easily by a vapor phase deposition method at low temperature and thus is suitable for mass production, is most widely used. A TFT including a semiconductor film formed of crystalline silicon has a sufficient drivability for a large current to realize a high operation speed, and further allows the peripheral driving circuit of the LCD to be formed integrally with the display section on the same single substrate. Because of these reasons, the TFT including a crystalline silicon layer is today a focus of attention.

As crystalline silicon used for an active matrix LCD; polysilicon, micro-crystallins silicon, semi-amorphous silicon having an intermediate state between the crystalline silicon, and amorphous silicon are known.

Japanese Laid-Open Patent Publication No. 5-218156 has proposed a method for forming a semiconductor film of crystalline silicon. In this method, an impurity element for promoting crystallization such as nickel acting as a crystal nucleus is introduced in a micro-amount to an amorphous silicon layer which is formed in advance. (In this specification, an element for promoting crystallization will be referred to as a "catalytic element".) The resultant layer is annealed at a temperature of 600° C. or lower, which allows use of an inexpensive glass substrate, for approximately four hours; thereby forming a layer which has a sufficient level of crystallinity. By such a method, the nucleus generation rate during an initial stage of crystallization and the nucleus growth rate thereafter can be significantly improved. Accordingly, the temperature required for the solid-phase crystallization can be lowered, and also the annealing period can be shortened. Moreover, the influence of the grain boundaries on the operation of the device can be minimized. Although the mechanism of the crystallization has not been clarified, it is assumed that crystal nuclei formed of a catalytic element such as nickel are generated on an initial stage, thereafter the crystal growth proceeds rapidly by the catalytic element such as nickel.

In this method, by introducing a catalytic element selectively to an area of an amorphous silicon layer on the substrate, a layer having a crystalline silicon area and an amorphous silicon area can be formed on the same single substrate; as is realized by the crystallization using laser light which is proposed in Japanese Patent Publication No. 2-61032. By consecutively performing annealing after the introduction of the catalytic element, the crystals grow from the crystal nuclei formed in the area to which the catalytic element has been introduced into an area peripheral thereof to further crystallize amorphous silicon in such peripheral area. Such crystal growth proceeds in a lateral direction, namely, in a direction parallel to a surface of the substrate. In this manner, the area which has been changed from the amorphous silicon layer into a crystalline silicon layer is extended. Hereinaftar, the area in which crystal growth has occurred will be referred to as a "lateral growth area". In the lateral growth area, needle-like or pillar-like crystals are grown in the lateral direction, and no grain boundary is formed across the direction in which the crystals are grown. Since there is no grain boundary, a high performance TFT having a high mobility can be produced by using the lateral growth area as a channel region.

Figure 6:
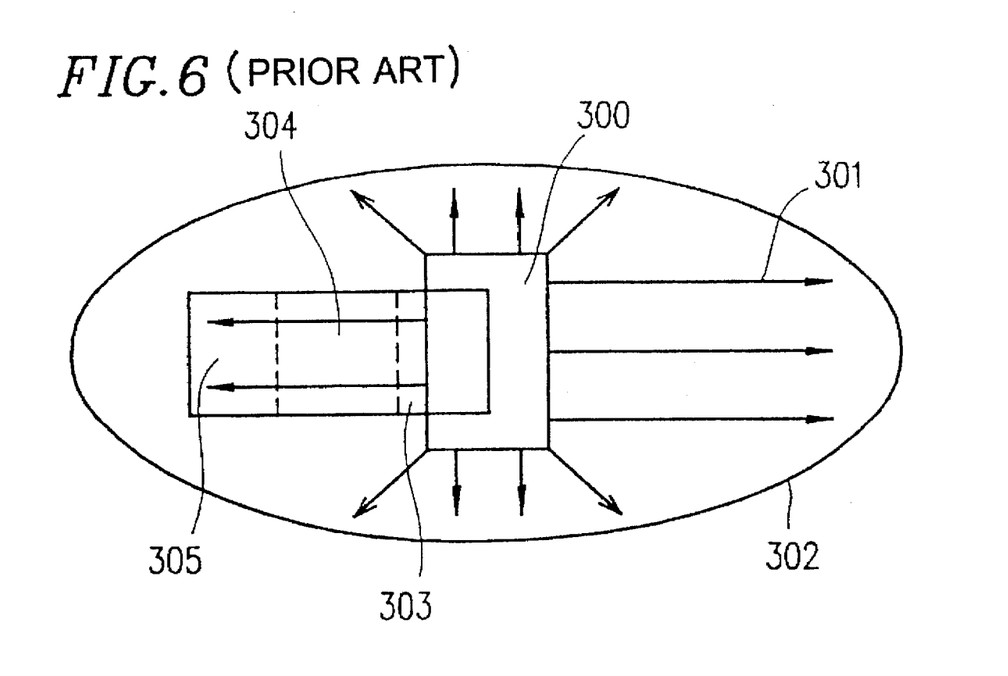
FIG. 6 is a view illustrating introduction of a catalytic element and lateral crystal growth performed in a conventional method.

With reference to FIG. 6, the above-described method for forming the lateral growth area and producing a TFT using the lateral growth area will be described. FIG. 6 is a plan view of a substrate having a TFT produced using the lateral growth area.

First, an amorphous silicon layer is formed on the entire substrate, and a mask layer is formed of silicon dioxide or the like on the amorphous silicon layer. A hole is formed in a catalytic element introduction region 300 of the mask layer, and a catalytic element such as nickel is introduced to the amorphous silicon layer through the hole.

Next, the resultant laminate is annealed at approximately 550° C. for approximately four hours. By such annealing, a region of the amorphous silicon layer corresponding to the catalytic element introduction area 300 is crystallized and the other region remains in an amorphous state.

The resultant laminate is consecutively annealed for approximately another eight hours at that same temperature. Then, crystal growth proceeds laterally as is indicated by arrows 301 from the catalytic element introduction region 300, thereby forming a lateral growth area 302. Hereinafter, the direction indicated by arrows 301 will be referred to as a "crystal growth direction".

Next, a TFT is produced from the lateral growth area 302 by a known method. The TFT is produced so that a source region 303, a channel region 304, and a drain region 305 are located as is shown in FIG. 6 with respect to the lateral growth area 302. By such an arrangement, carriers move in the same direction as the crystal growth direction 301. Thus, the resultant TFT has a high mobility since no grain boundary is formed across the direction in which the carriers move.

By using the resultant high performance TFT having a high mobility as a driving device of a peripheral driving circuit located outside the display section, a high frequency operation required for such a peripheral circuit can be realized In detail, such a TFT is produced in the following manner.

An amorphous silicon layer is formed on an insulation substrate formed or glass or the like. A layout of an LCD, for example, is determined so that a peripheral driving circuit surrounds a display section. A catalytic element such as nickel is introduced to selected areas of the amorphous silicon layer assigned to the peripheral driving circuit, thereby forming the lateral growth area 302.

Then, source/drain regions are formed in the lateral growth area 302 in a direction parallel to the crystal growth direction 301. In an area of the amorphous silicon layer assigned to the display section, source/drain regions are formed in a direction perpendicular to the crystal growth direction 301. In this manner, a TFT used for a peripheral driving circuit and a TFT used for a pixel electrode are formed separately.

Forming the two types of TFTs separately is advantageous for the following reasons: A TFT used for a peripheral driving circuit needs to have a high mobility in order to operate in a high frequency range. Such a TFT needs to allow a large "ON" current to flow therethrough. A TFT used for a pixel electrode need not have a very high mobility in order to improve the charge retaining ratio, but needs to restrict the "OFF" current to a low level. The "OFF" current is a leak current flowing between the source region and the drain region when a gate is supplied with a reverse bias voltage.

The TFT for a peripheral driving circuit needs to have a structure in which the carriers are not influenced by the grain boundaries while moving between the source region and the drain region in order to have a high mobility. The TFT for a pixel electrode needs to have a structure in which the carriers move across the grain boundaries between the source region and the drain region in order to provide a high resistance between that source region and the drain region and thus lower the "OFF" current. The above-described requirements for the two types of TFTs are described bed in Japanese Laid-Open Patent Publication No. 5-218156.

A TFT for a peripheral driving circuit produced by the above-described method has the following problems: In a crystal growth area between the sources region and the drain region, a catalytic element such as nickel introduced to promote the crystal growth is heavily segregated along the grain boundaries, and accordingly trap levels of the carriers are formed. As a result, the level of the "OFF" current generated through the catalytic element which is segregated in the vicinity of the source region and in the vicinity of the drain region increases to an excessively high level which cannot be ignored. Further, a TFT for a pixel electrode cannot reduce the "OFF" current sufficiently despite the structure in which the carriers move across the grain boundaries between the source region and the drain region.

Figure 7:
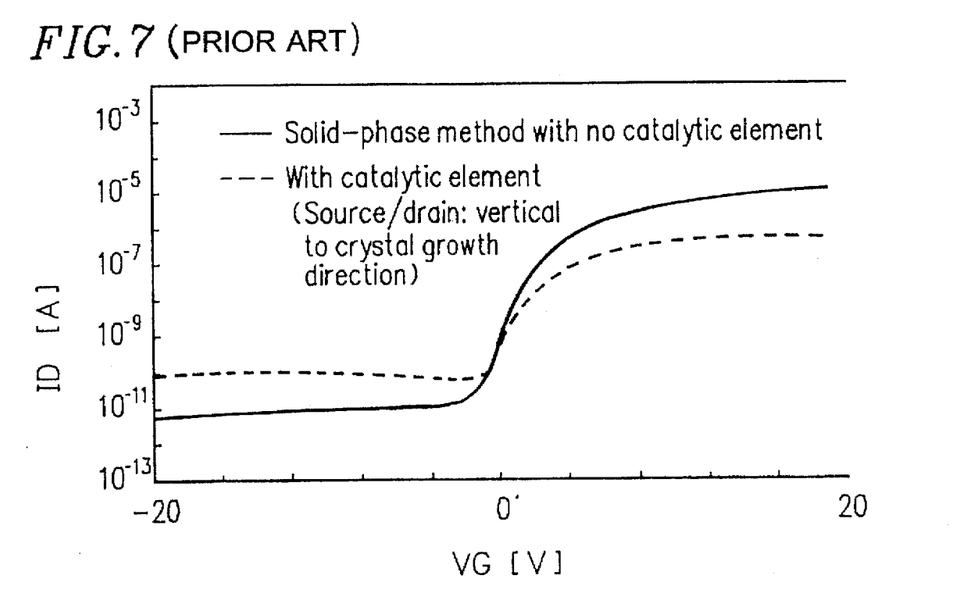
FIG. 7 is a graph illustrating the dependency of the drain current on the gate voltage in TFTs formed by conventional methods.

FIG. 7 is a graph illustrating the dependency of the drain current on the gate voltage in TFTs formed by conventional methods. The solid line in FIG. 7 represents such dependency of a TFT formed using a conventional solid-phase crystal growth method with no introduction of a catalytic element, and the dashed line represents such dependency of a TFT formed with introduction of a catalytic element, in which the carriers move across the grain boundaries between the source region and the drain region. As is appreciated from FIG. 7, the level of the "OFF" current of the latter TFT is higher than the level of the "OFF" current of the former TFT by one order or more.

SUMMARY OF THE INVENTION

In one aspect of the present invention, a semiconductor device includes a first thin film transistor having a first channel layer formed of a first crystalline silicon layer and a second thin film transistor having a second channel layer formed of a second crystalline silicon layer. The first crystalline silicon layer and the second crystalline silicon layer are located an a single substrate. The second crystalline silicon layer includes a catalytic element for promoting crystallization and has a higher mobility than the mobility of the first crystalline silicon layer.

In one embodiment of the invention, the second crystalline silicon layer is formed of a lateral growth area formed as a result of crystal growth in a direction substantially parallel to a surface of the substrate from an area of an amorphous silicon layer including the catalytic element introduced thereto.

In one embodiment of the invention, the catalytic element is formed of at least one material selected from the group consisting of nickel, iron, cobalt, palladium, platinum, tin, indium, aluminum, gold, silver, antimony, copper, arsenic, and phosphorus.

In another aspect of the present invention, a method for producing a semiconductor device including a first thin film transistor having a first channel layer formed of a first crystalline silicon layer and a second thin film transistor having a second channel layer formed of a second crystalline silicon layer includes the steps of forming an amorphous silicon layer having a selected area including a catalytic element introduced thereto for crystal growth on a substrate having an insulation surface; performing first annealing to generate a crystal nucleus in the selected area of the amorphous silicon layer, thereby crystallizing the selected area, and consecutively causing crystal growth to proceed in a lateral direction from the selected area to form the second crystalline silicon layer; and performing second annealing to crystallize the rest of the amorphous silicon layer which remains in an amorphous state after the first annealing, thereby forming the first crystalline silicon layer.

In one embodiment of the invention, the second annealing is performed at a higher temperature then the first annealing.

In still another aspect of the present invention, a liquid crystal display device includes a display section including a liquid crystal layer, a pair of substrates interposing the liquid crystal layer, a plurality of pixel electrodes located in a matrix on one of the pair of substrates, and a plurality of first thin film transistors respectively connected to the plurality of pixel electrodes, and a peripheral driving circuit located for driving the display section, the peripheral driving circuit being located on the substrate on which the first thin film transistors are located and having a second thin film transistor. Each of the first thin film transistors includes a first channel layer formed of a first crystalline silicon layer, and the second thin film transistor includes a second channel layer formed of a second crystalline silicon layer having a higher mobility than the mobility of the first crystalline silicon layer, and the second crystalline silicon layer includes a catalytic element for promoting crystallization, In one embodiment of the invention, that second crystalline silicon layer is formed of a lateral growth area formed as a result of crystal growth in a direction substantially parallel of a surface of the substrate from a selected area of an amorphous silicon layer including the catalytic element introduced thereto.

In one embodiment of the invention, the second thin film transistor is located so as to move carriers substantially in the direction of crystal growth.

In one embodiment of the invention, the second crystalline silicon layer is formed as a result of crystallization performed at a temperature of less than 600° C., and the first crystalline silicon layer is formed as a result of crystallization performed at a temperature of no less than 600° C.

In one embodiment of the invention, the catalytic element is introduced to the amorphous silicon layer used to form the second crystalline silicon layer at a concentration of no greater than $5.0 \times 10^{15}$ atoms/cm$^2$.

Thus, the invention described herein makes possible the advantages of (1) providing a semiconductor device including TFTS having different properties from each other and a method for producing the same, and (2) providing an LCD including a TFT for a pixel electrode and a TFT for a peripheral driving circuit which are formed on the same single substrate and have properties required for the respective purposes.

These and other advantages of the present invention will become apparent to those skilled in the art upon reading and understanding the following detailed description with reference to the accompanying figures.

BRIEF DESCRIPTION OF THE DRAWINGS

FIG. 1 is a sectional view of a liquid crystal device according to the present invention including a liquid crystal interposed between two substrates.

DESCRIPTION OF THE PREFERRED EMBODIMENTS

The inventors of the present invention have found the following.

In an area of an amorphous silicon layer to which a catalytic element such as nickel is not introduced, no crystal nucleus is generated when the amorphous silicon layer is annealed at a temperature of less than 600° C. Only by annealing such an area at a temperature of 600° C. or higher, crystal nuclei for crystallization are generated and crystallization occurs. Utilizing such a phenomenon, by annealing the amorphous silicon layer while introducing a catalytic element such as nickel into a selected area of the amorphous silicon layer and further using two annealing temperatures (one less than 600° C. and the other 600° C. or higher), two types of silicon layers can be formed on the same single substrate. One silicon layer is formed on the area to which the catalytic element has been introduced and has a substantially uniform crystal growth direction. Such a silicon layer is suitable for a TFT having a relatively large "OFF" current but having a high mobility. The other silicon layer, which is formed in the remaining area of the amorphous silicon layer including no catalytic element, has a level of crystallinity which is suitable to form a TFT having a low mobility but restricting the "OFF" current to a low level. The former TFT is used for a peripheral driving circuit, and the latter TFT is used for driving a pixel electrode in a display section. Hereinafter, the area of an amorphous silicon layer or a crystalline silicon layer which is assigned for a display section of, for example, an LCD will be referred to as a "display area"; and the area of an amorphous silicon layer or a crystalline silicon layer which, is assigned for a peripheral driving circuit of, for example, an LCD will be referred to as a "peripheral driving circuit area".

The present invention will be described in more detail. In practicing the present invention, it is not absolutely necessary to introduce the catalytic element through a certain area (such as an area 100 described later; corresponding to the catalytic element introduction area 300 in FIG. 6).

First, a crystalline silicon layer and a TFT which are formed by introducing a catalytic element to the entire peripheral driving circuit area of an amorphous silicon layer will be described.

Such a crystalline silicon layer includes crystal grains each having a plurality of pillar-like crystals, each of which has a width of approximately 100 nm, Each crystal grain is extended at an angle of approximately 10 degrees. Accordingly, even though each pillar-like crystal has a satisfactory level of crystallinity, the crystalline silicon layer has crystal defects (dislocations) at a relatively high density.

The grain size is 30 to 40 μm, which is larger than that of a polysilicon film formed by a usual solid-phase crystal growth method with no introduction of a catalytic element. If a TFT having a size of, for example, L (channel length)/W (channel width)=10 μm/10 μm is formed using a crystalline silicon layer having a grain size of such a range, a relatively high mobility is obtained due to the substantially uniform crystal orientation in the channel region, but the threshold voltage and the level of the "OFF" current are difficult to be lowered due to the high density of the crystal defects.

In order to lower the threshold voltage and the level of the "OFF" current in such a TFT, an area corresponding to a catalytic element introduction area 300 (an area 100 described later) is preferably used to introduce the catalytic element to a selected area of the peripheral driving circuit area of the amorphous silicon layer. In this way, a crystalline silicon layer having a single crystal growth direction (substantially parallel to the surface of the substrate) and also a very low density of crystal defects can be obtained. Such a high level of crystallinity cannot be obtained by a method of introducing a catalytic element to the entire peripheral driving circuit area.

A TFT for a pixel electrode is produced using a crystalline silicon layer formed by a conventional solid-phase crystal growth method with no introduction of a catalytic element. The TFT produced in this method restricts the level of the "OFF" current to a low level.

In a solid-phase crystal growth process, when the amorphous silicon layer is annealed at a temperature of less than 600° C. as first annealing, crystal nuclei are generated only by the effect of the catalytic element in the peripheral driving circuit area. Different from the case of using a conventional solid-phase crystal growth method, natural generation of crystal nuclei does not occur at all. Accordingly, a very high level of crystallinity is obtained.

Next, the resultant layer is further annealed at a temperature of 600° C. or more as second annealing. By annealing performed at such a temperature, the crystallinity of the peripheral driving circuit area including the catalytic element is further improved. In the display area which remained in an amorphous state, natural generation of crystal nuclei occurs. As a result, the entire layer is crystallized.

In order to minimize the influence of the catalytic element on the TFT for a peripheral driving circuit as an impurity, the catalytic element is preferably introduced at a concentration of $5.0 \times 10^{13}$ atoms/cm$^2$ or less. The reason is appreciated from FIG. 8.

Figure 8:
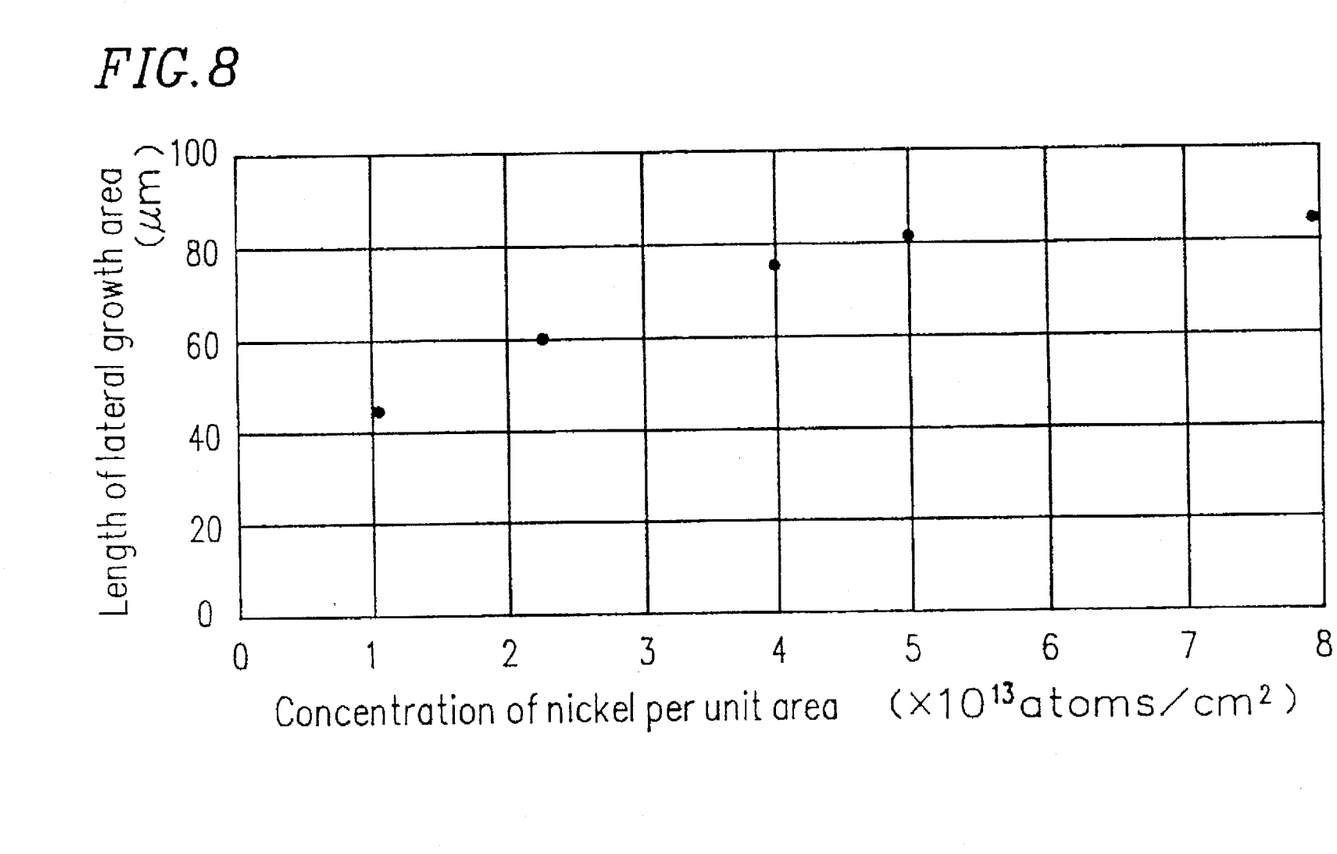
FIG. 8 is a graph illustrating dependency of the length of the lateral growth area on the concentration of the catalytic element per unit area.

FIG. 8 shows the dependency of the length of the lateral growth area on the concentration of nickel used as a catalytic element per unit area. The vertical axis represents the length of the lateral growth area, and the horizontal axis represents the concentration of nickel. As is appreciated from FIG. 8, the length of the lateral growth area increases in proportion to the concentration of nickel until the concentration of nickel becomes $5.0 \times 10^{13}$ atoms/cm$^2$ (the length of the lateral growth area: 90 μm), but when the concentration of nickel exceeds $5.0 \times 10^{13}$ atoms/cm$^2$, the length of the lateral growth area does not increase further significantly.

As a result of the above-mentioned two-stage annealing, a silicon layer suitable for a TFT having a high mobility as required for a peripheral circuit and a silicon layer suitable for a TFT restricting the "OFF" current to a low level as is required for a pixel electrode can be formed on the same single substrate. Especially, the crystalline silicon layer in which carriers move in the crystal growth direction is effective in significantly improving the mobility of the TFT.

The catalytic element is preferably formed of at least one material selected from the group consisting of nickel (Ni), iron (Fe), cobalt (Co), palladium (Pd), platinum (Pt), tin (Sn), indium (In), aluminum (Al), gold (Au), silver (Ag), antimony (Sb), copper (Cu), arsenic (As), and phosphorus (P). Use of such a catalytic element realizes uniform crystallinity, enlargement of the display section, and improvement of throughput. These advantages have not been realized by a conventional laser anneal method, which is one of the methods for crystallizing amorphous silicon into crystalline silicon. The technology for crystallizing amorphous silicon into crystalline silicon at a low temperature using a catalytic element can be considered to be a novel technology, which is completely different from the conventional crystallization technologies such as the laser anneal method.

An example of the present invention will be described with reference to FIGS. 1 and 5.

Figure 1:
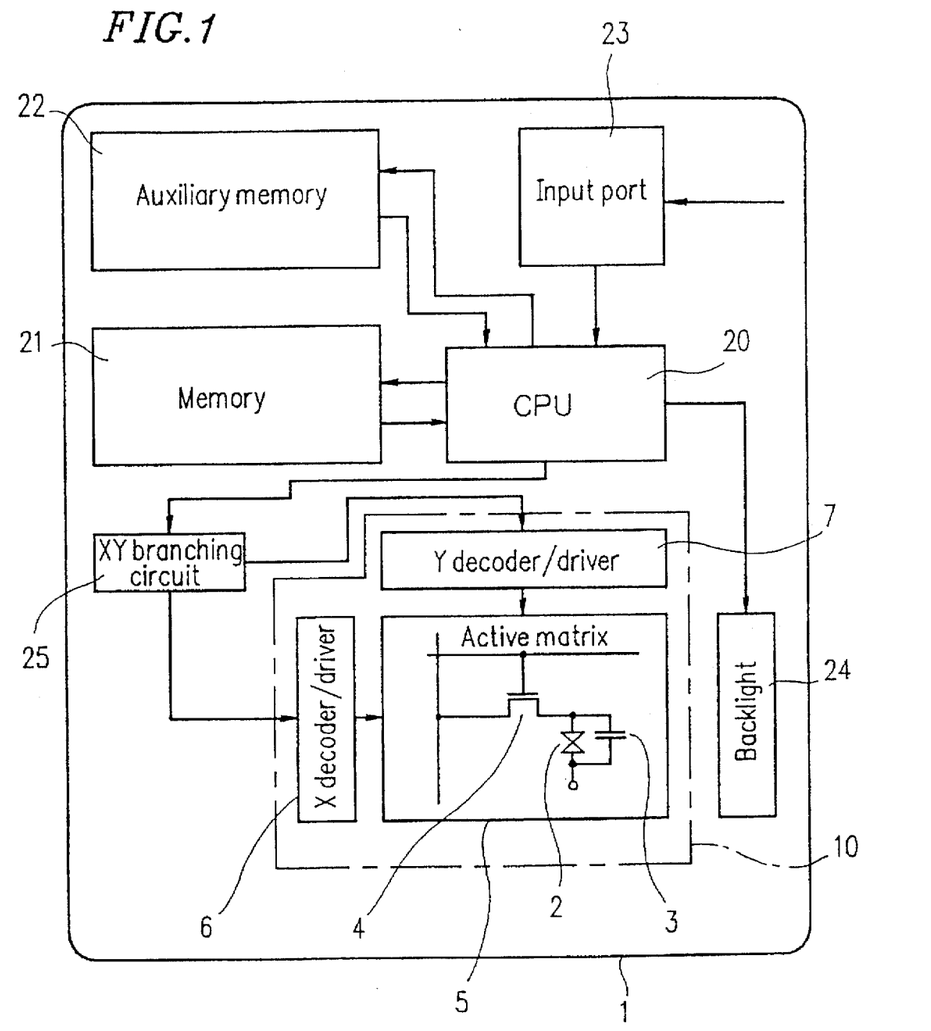
FIG. 1 is a block diagram of an electronic device including an LCD according to the present invention and an electrooptical system mounted on a single substrate.

FIG. 1 is a block diagram of an electronic device including an LCD 10 and an electrooptical system both mounted on a single insulation substrate. In addition to the LCD 10, the electronic device includes a CPU 20, a memory 21, an auxiliary memory 22, an input port 23 from which electric signals are input, a backlight 24, and an XY branching circuit 25. The CPU 20, the memory 21, the auxiliary memory 22, and the XY branching circuit 25 are formed of a thin film transistors. The LCD 10 is obtained from laminate including a pair of substrates opposed to each other and a liquid crystal layer interposed therebetween. The LCD 10 includes a plurality of pixel capacitances 2, a plurality of auxiliary capacitances 3, and a plurality of pixel switching devices 4 each for switching the corresponding pixel capacitance 2 to an ON state and an OFF state. The pixel capacitances 2, the auxiliary capacitances 3, and the pixel switching devices 4 are provided in a matrix in a display section 5 of the LCD 10. The LCD 10 further includes an X decoder/driver 6 and a Y decoder/driver 7 in a peripheral section 8.

Figure 1A:
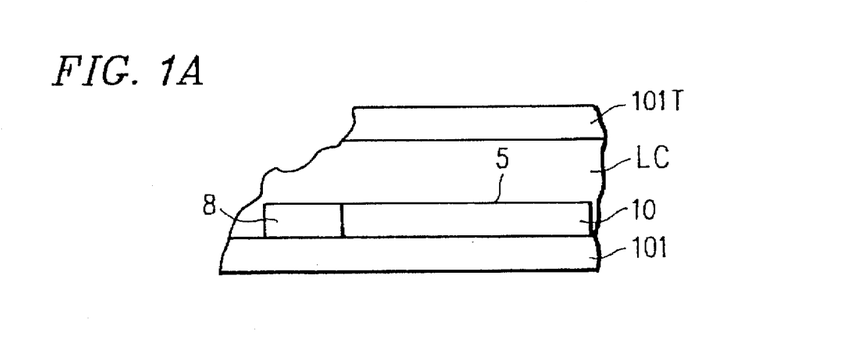

As illustrated in FIG. 1A, liquid crystal display device 1 of the invention includes display section 5. Display section 5 includes a liquid crystal layer LC and a pair of substrates 101 and 101T interposing liquid crystal layer LC. Peripheral driving circuit 8 for driving the display section 5 is located on substrate 101.

TFTs used in the LCD 10 are produced in the following manner.

First, an amorphous silicon layer is formed entirely on a substrate. A display area of the amorphous silicon layer on which a display section will be formed is covered with a resist, and a catalytic element (nickel in this example) is introduced to a peripheral driving circuit area on which a peripheral circuit such as a driving circuit will be formed. The peripheral driving circuit area including nickel is annealed at a temperature of less than 600° C. for less than 24 hours as first annealing, thereby causing crystal growth. As a result, the peripheral driving circuit area is crystallized into a crystalline silicon layer, and the display area remains in an amorphous state. Then, the entire layer including the display area is annealed at a temperature of 600° C. or higher for 24 hours or longer, thereby crystallizing amorphous silicon in the display area into crystalline silicon.

FIGS. 2A through 2I are cross sectional views illustrating each step of a method for forming an NTFT and a PTFT as complementary TFTs included in the peripheral circuit such as a driving circuit. FIGS. 3A through 3G are cross sectional views illustrating each step of a method for forming an NTFT included in the display section. The steps illustrated in FIGS. 2A through 2I and the steps illustrated in FIGS. 3A through 3G are performed on the same single substrate. The steps corresponding to each other are performed simultaneously. The step shown in FIGS. 2A through 2D corresponds to the step shown in FIGS. 3A and 3B. The step shown in FIGS. 2E through 2G corresponds to the step shown in FIGS. 3C through 3E. The step shown in FIGS. 2H and 2I corresponds to the step shown in FIGS. 3F and 3G.

Figure 2A:
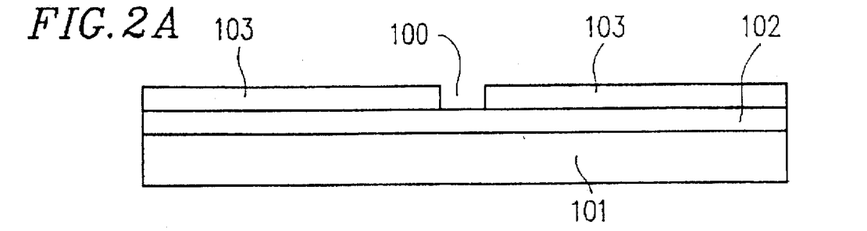
FIGS. 2A through 2I are cross sectional views illustrating production steps of TFTs used for a peripheral driving circuit formed on an active matrix substrata of the LCD in a method according to the present invention.
Figure 3A:
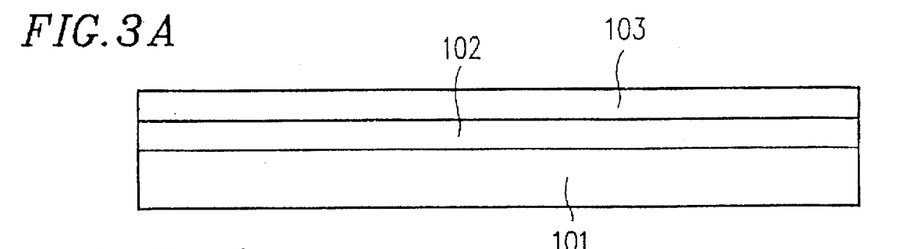
FIGS. 3A through 3G are cross sectional views illustrating production steps of TFTs used for a pixel electrode formed on the active matrix substrate of the LCD in a method according to the present invention.

First, as are shown in FIGS. 2A and 3A, on an insulation substrate 101 formed of glass or the like (for example, Corning 7059® produced by Corning, Inc.), a base layer 102 is formed to a thickness of 20 to 100 nm by sputtering.

Next, a mask 103 of a metal mask, a silicon oxide layer, or the like is formed on the base layer 102 so as to expose a slit-like area 100 of the base layer 102.

Figure 2B:
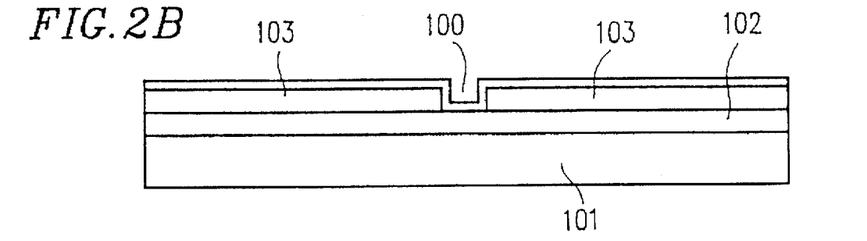

As is shown in FIG. 2B, on the mask 103, a nickel layer is formed to a thickness of 0.1 to 20 nm, for example, 2 nm by sputtering.

Figure 2C:
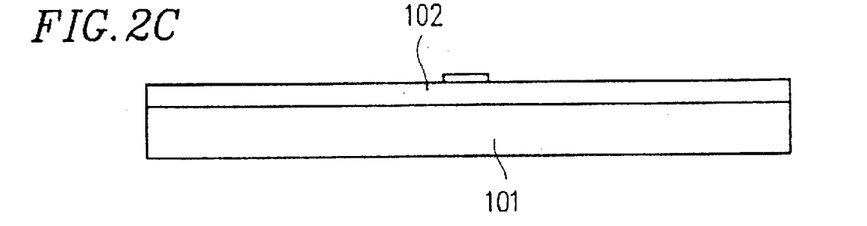

As is shown in FIG. 2C, the mask 103 is removed, thereby leaving the nickel layer only on the area 100. In other words, nickel is introduced to the area 100 in a micro-amount.

Figure 2D:
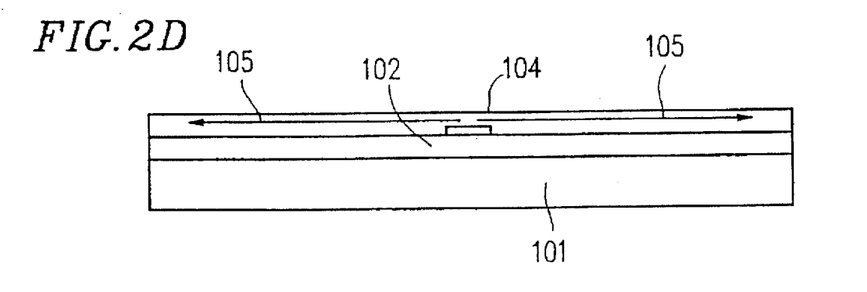
Figure 3B:
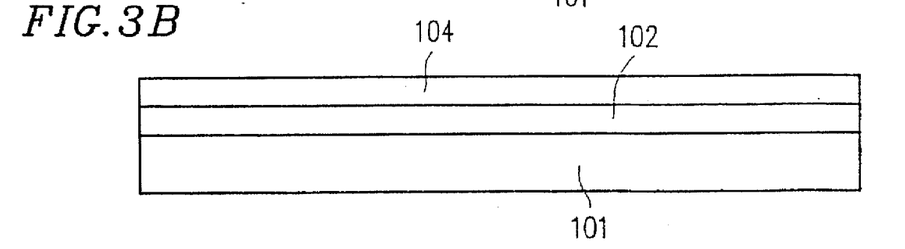

As are shown in FIGS. 2D and 3B, an amorphous silicon layer 104 which is an intrinsic semiconductor is formed to a thickness of 30 to 200 nm, for example, 100 nm to cover the base layer 102 by plasma CVD or low pressure CVD.

The resultant laminate is annealed at a temperature of less than 600° C. for less than 24 hours in a hydrogen-reducing atmosphere (preferably having a partial pressure of hydrogen of 0.1 to 1 atmosphere), or an inert gas atmosphere (one atmosphere), thereby crystallizing the amorphous silicon layer 104. The above-described annealing is performed, for example, at 550° C. for 16 hours. In the area 100 on which the nickel layer is formed, crystallization occurs in the direction vertical to the surface of the substrate 101. In an area surrounding the area 100, crystal growth proceeds laterally from the area 100 in the direction parallel to the surface of the substrate 101 (as is indicated by arrow 105 in FIG. 2D), thereby forming a lateral growth area. As a result, a high quality crystalline silicon layer (also indicated by reference numeral 104), in which the crystal growth direction is substantially uniform, is obtained. As will be described later, in the TFT used for the peripheral circuit shown in FIG. 2I, source/drain regions are arranged along the crystal growth direction. The length of the crystal growth area in the direction 105 in FIG. 2D is 40 to 90 µm.

In the above-described example, the mask 103 is removed after formation of the nickel layer before crystallization. The crystallization occurs in the same manner even if the mask 103 is not removed. In the case that annealing is performed at a temperature between 500° C. and 600° C. for 10 hours or more, the thickness of the mask 103 is preferably 50 nm or more. If annealing is performed, for example, at 550° C. for 16 hours or more using the mask 103 having a thickness of less than 50 nm, nickel on the mask 103 is thermally diffused into the mask 103 and further into the amorphous silicon layer 104, and thus crystal growth undesirably occurs from a position in the other area than the area 100.

As is described above, after performing annealing at 550° C. for 16 hours, the display area of the amorphous silicon layer 104 remains in an amorphous state.

Then, annealing is performed at a temperature of 600° C. or higher for 24 hours or longer. By such annealing, the entire layer is changed into the crystalline silicon layer.

Figure 2E:
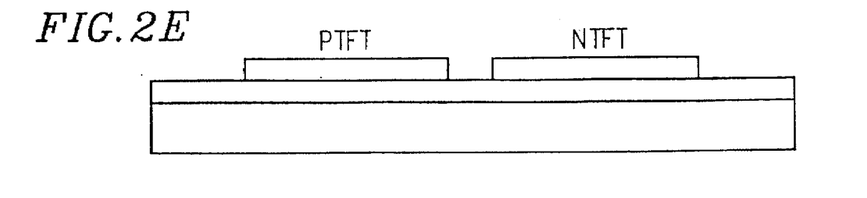
Figure 3C:
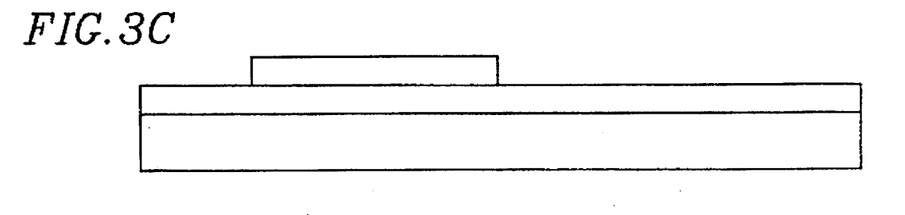

As is shown in FIG. 2E, isolation is performed, and unnecessary areas of the crystalline silicon layer 104 are removed, thereby forming regions for a PTFT and an NTFT in the peripheral area. In the display area also, as is shown in FIG. 3C, unnecessary areas of the crystalline silicon layer 104 are removed, thereby forming a region for an NTFT. Preferably, nickel does not remain between the regions for the PTFT and the NTFT after isolation. In this manner, only the lateral growth area is used to form the TFT, and thus the level of the "OFF" current is reduced more efficiently.

Figure 2F:
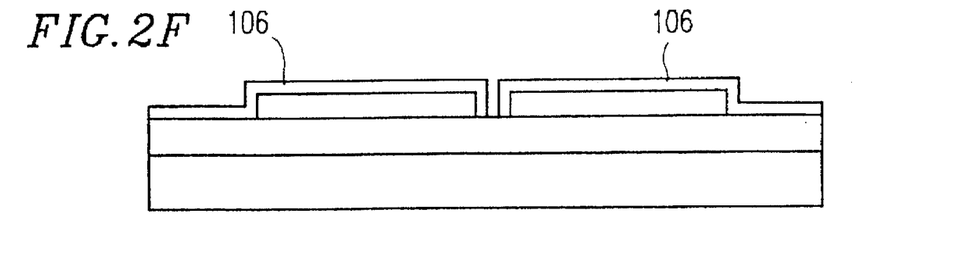
Figure 3D:
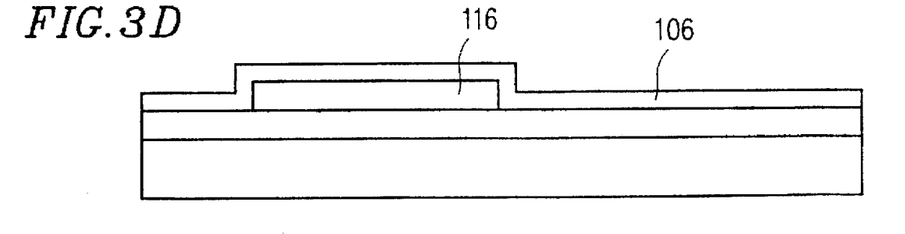

As are shown in FIGS. 2F and 3D, a silicon oxide layer 106 is then formed to a thickness of 100 nm by sputtering as a gate insulation layer. The sputtering is performed using a target formed of silicon oxide at a substrate temperature of 200° to 400° C. (for example, 350° C.) in an atmosphere of oxygen and argon gas with the argon/oxygen ratio of 0 to 0.5 or less (for example, 0.1).

Figure 2G:
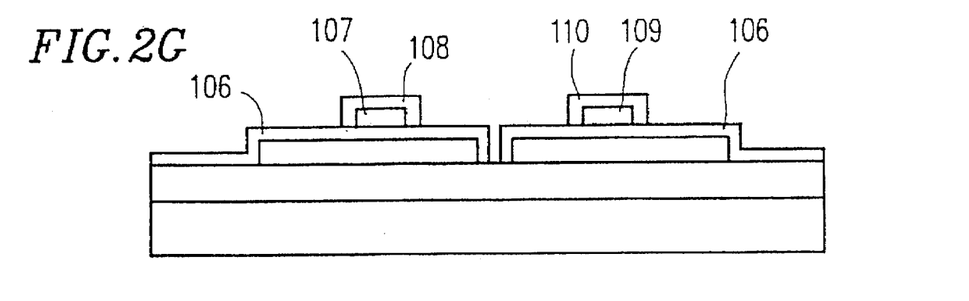
Figure 3E:
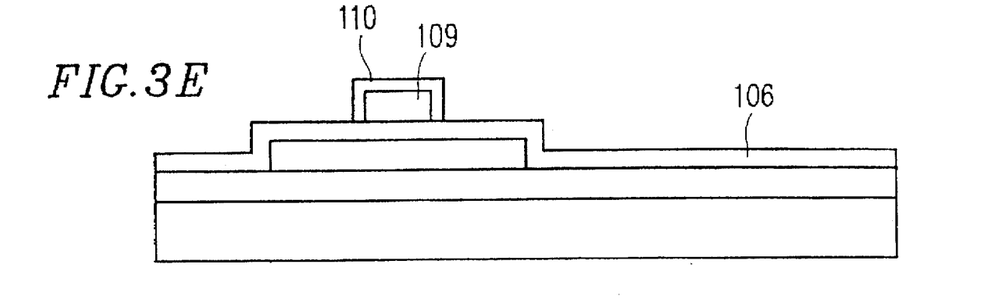

As are shown in FIGS. 2G and 3E, an aluminum layer (containing silicon at a ratio of 0.1 to 2%) is formed to a thickness of 600 to 800 nm (for example, 600 nm) by sputtering. The formation of the silicon oxide layer 106 and the formation of the aluminum layer are preferably performed consecutively. The aluminum layer is patterned, thereby forming gate electrodes 107 and 109.

Next, surfaces of the gate electrodes 107 and 109 are anodized to form oxide layers 108 and 110. The anodization is performed in a solution of ethylene glycol containing tartaric acid at a ratio of 1 to 5%. The oxide layers 108 and 110 each have a thickness of 200 nm. The oxide layers 108 and 110 are used to form an offset gate region in ion doping which follows. Namely, the length of the offset gate region can be determined during anodization.

Figure 2H:
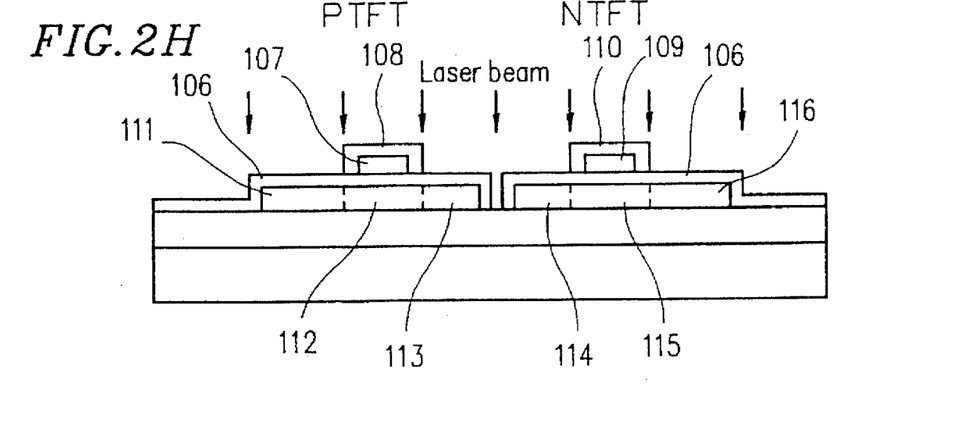
Figure 3F:
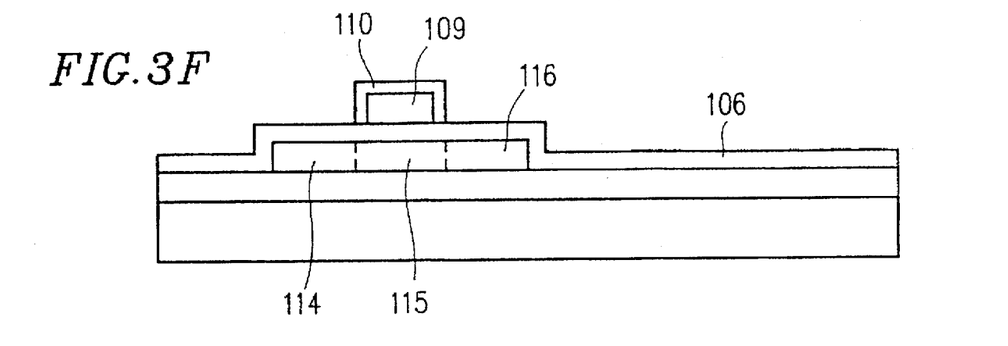

Next, metal elements as impurities (phosphorus and boron in this example) are implanted into an active region by ion doping using the gate electrodes 107 and 109 and the oxide layers 108 and 110 as masks. As doping gas, phosphine ($PH_3$) and diborane ($B_2H_6$) are used. When phosphine is used for a doping gas, the acceleration voltage is 60 to 90 kV (for example, 80 kV). When diborane is used, the acceleration voltage is 40 to 80 kV (for example, 65 kV). The impurities are implanted in the range of $1\times10^{15}$ to $8\times10^{15}$ $cm^{-2}$ (for example, $2\times10^{15}$ $cm^{-2}$ of phosphorus and $5\times10^{15}$ $cm^{-2}$ of boron). Each of the elements is doped to a respective part of the active region by covering an area which is not required to be doped with a photoresist. As a result, as are shown in FIGS. 2H and 3F, n-type impurity regions 114 and 116 (source/drain regions) and p-type impurity regions 111 and 113 (source/drain regions) are formed. Regions 115 between the n-type impurity regions 114 and 116 and a region 112 between the p-type impurity regions 111 and 113 act as channel regions.

In this manner, a plurality of PTFTs each having a p-type channel region and a plurality of NTFTs each having an n-type channel region are formed in the peripheral driving circuit area (FIG. 2H). The NTFTs are formed in the display area (FIG. 3F).

Laser light is then radiated to the resultant laminate to perform annealing (laser anneal), thereby activating the impurities implanted by ion doping. As laser light, KrF excimer laser having a wavelength of 248 nm and a pulse width of 20 nsec is used. Other types of laser light are also usable. The laser is radiated at an energy concentration of 200 to 400 $mJ/cm^2$ (for example, 250 $mJ/cm^2$) with two to ten shots (for example, two shots) per position to be irradiated. It is required that the substrate is heated to approximately 200° to 450° C. before laser light radiation. In the area which is crystallized before the laser anneal, nickel is diffused. Accordingly, crystallization proceeds easily in such an area by laser annealing. Thus, the impurity regions 111 and 113 doped with a p-type impurity and the impurity regions 114 and 116 doped with an n-type impurity can be easily activated.

Figure 2I:
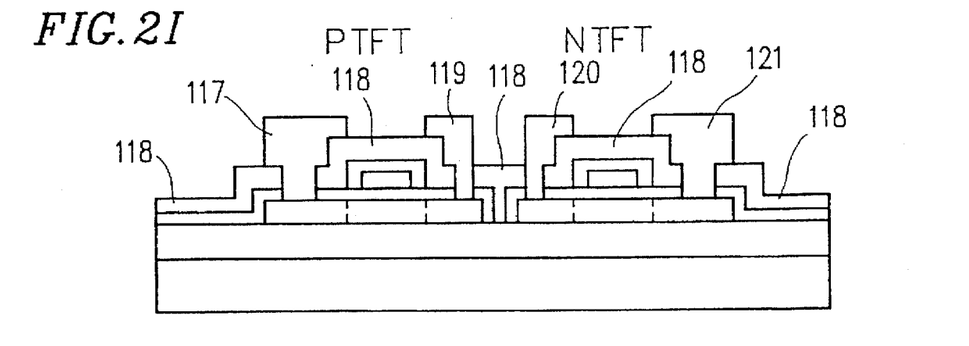
Figure 3G:
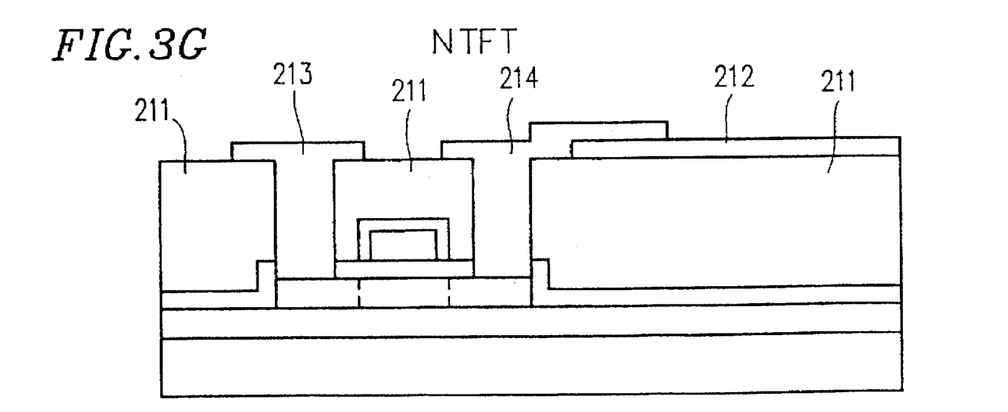

In the peripheral driving circuit area, as is shown in FIG. 2I, a silicon oxide layer 118 is formed to a thickness of 600 nm by plasma CVD as an interlevel insulation layer. Contact holes are formed in the silicon oxide layer 118, and electrodes and wires 117, 119, 120 and 121 for the TFTs are formed by depositing and etching a titanium nitride layer and an aluminum layer. In the display area, as is shown in FIG. 3G, an interlevel insulation layer 211 is formed of silicon oxide. After contact holes are formed in the interlevel insulation layer 211, an ITO electrode 212 acting as a pixel electrode is formed, and metal wires 213 and 214 are formed.

The resultant laminate is annealed at a temperature of 350° C. for 30 minutes in a hydrogen atmosphere of 1 atmosphere, thereby completing TFTs for a peripheral circuit and TFTs for pixel electrodes.

Figure 4:
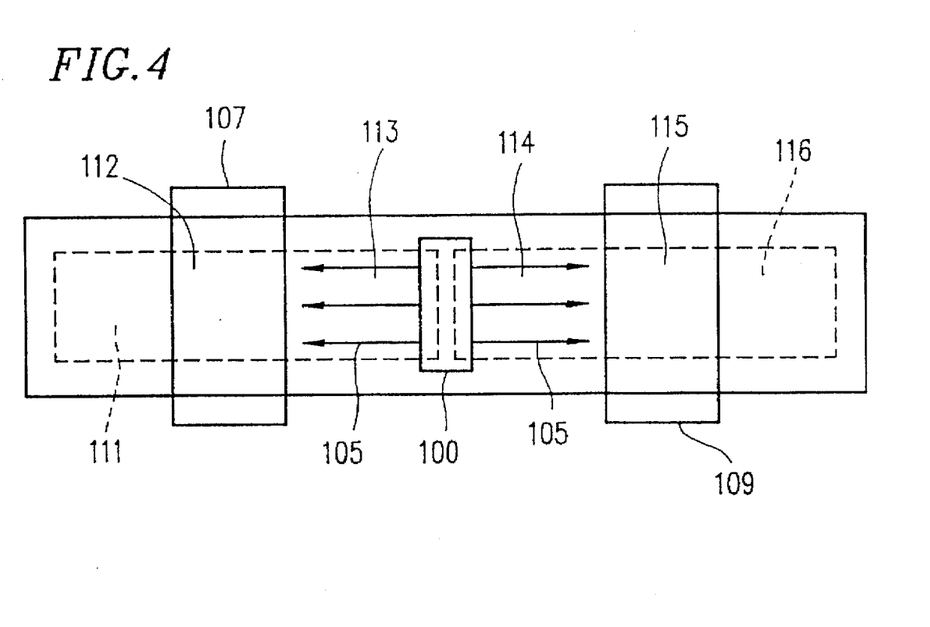
FIG. 4 is a plan view of the laminate illustrated in FIG. 2I.

FIG. 4 is a plan view of the laminate shown in FIG. 2I. Nickel is introduced to the area 100 in a micro-amount, and crystal growth proceeds laterally in the direction indicated by arrow 105. In such a lateral growth area, source/drain regions 111 and 113 and the channel region 112 are formed for the PTFT. Further, source/drain regions 114 and 116 and the channel region 115 are also formed in such an area for the NTFT. In the peripheral driving circuit area shown in FIGS. 2I and 4, the carriers move in the crystal growth direction 105. Since the carriers do not substantially move across the grain boundaries, the resultant TFTs have a high mobility.

In the above-described example, nickel is introduced by forming a thin nickel layer (which is difficult to be observed as a layer due to an extreme thinness thereof) on a selected area of the base layer 102 below the amorphous silicon layer 104, and causing crystal growth from the selected area. In an alternative method, after the amorphous silicon layer 104 is formed, nickel is introduced to a selected area of a top surface of the amorphous silicon layer 104 in a microamount. The same effects are obtained whether crystal growth occurs on top of or below the amorphous silicon layer 104.

Figure 5A:
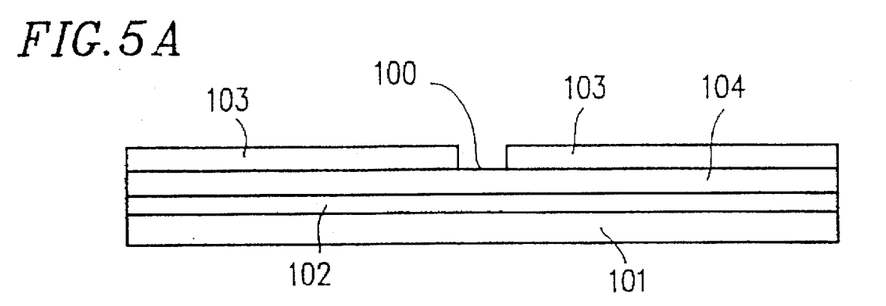
FIGS. 5A and 5B are cross sectional views illustrating production steps of a TFT for a peripheral driving circuit formed on an active matrix substrate of an LCD in another method according to the present invention.
Figure 5B:
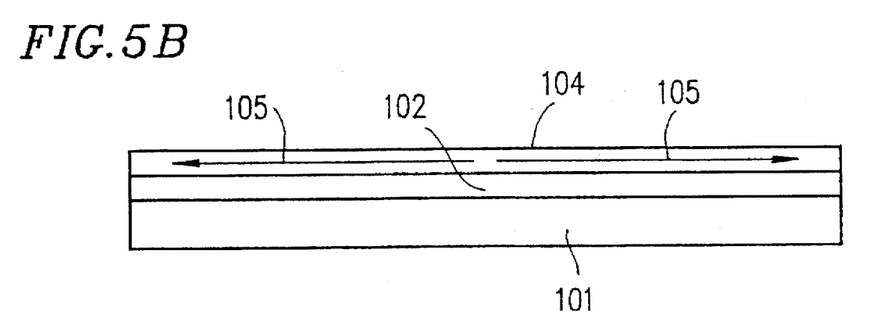

With reference to FIGS. 5A and 5B, a method for causing crystal growth on top of the amorphous silicon layer 104 will be described.

First, as is shown in FIG. 5A, a base layer 102 is formed of silicon oxide to a thickness of 20 to 100 nm on an insulation substrate 101 (for example, 7059® produced by Corning, Inc.) by sputtering.

An amorphous silicon layer 104, which is an intrinsic semiconductor, is then formed to a thickness of 30 nm to 200 nm, for example, 100 nm by plasma CVD or low pressure CVD.

A mask 103 of a metal, a silicon oxide layer or the like is formed on the amorphous silicon layer 104 so as to expose a slit-like area 100 of the amorphous silicon layer 104.

Then, a nickel layer (not shown) is formed to a thickness of 0.5 to 20 nm, for example, 2 nm by sputtering.

The resultant laminate is annealed at a temperature of less than 600° C. for less than 24 hours, for example, at 550° C. for 16 hours, in a hydrogen-reducing atmosphere (preferably having a partial pressure of hydrogen of 0.1 to 1 atmosphere) or an inert gas atmosphere having one atmosphere. As is shown in FIG. 5B, in the area 100, the crystal growth occurs in the direction vertical to the surface of the substrate 101; and in an area surrounding the area 100, crystal growth occurs in the direction parallel to the substrate 101 as is indicated by arrows 105. As a result, a high quality crystalline silicon layer (also indicated by reference numeral 104) is obtained in which the crystal growth direction is substantially uniform.

Instead of the above-described annealing, energy of laser light is also usable to crystallize amorphous silicon into crystalline silicon. For such laser anneal, two annealing temperatures also need to be provided: one below 600° C. and the other 600° C. or higher.

In an alternative method according to the present invention, after the formation of the amorphous silicon layer 104, nickel ions are implanted to a selected area of the amorphous silicon layer 104 by ion doping. In such a case, the concentration of nickel can be controlled at a relatively high precision.

In an alternative method according to the present invention, nickel is introduced in a micro-amount using a nickel electrode by plasma processing, instead of forming a thin nickel layer. Nickel can also be introduced in a micro-amount by applying an aqueous solution or an alcohol solution of nickel nitrate or nickel acetate.

The same effects are obtained by using, as a catalytic element for promoting crystallization, iron (Fe), Cobalt (Co), palladium (Pd), platinum (Pt), tin (Sn), indium (In), aluminum (Al), gold (Au), silver (Ag), antimony (Sb), copper (Cu), arsenic (As), or phosphorus (P). Needless to say, these materials can be used independently or in combination of two or more.

In the above-described example, the catalytic element is introduced to the amorphous silicon layer 104 through the area 100. In an alternative method, the catalytic element is introduced to the entire peripheral driving circuit area.

For example, the present invention is applicable to a contact-type image sensor, a thermal head including a built-in driver, an optical writing device or a display device including a built-in driver and using a luminous element such as an EL device formed of an organic material, and a three-dimensional IC in addition to an active matrix substrate of an LCD.

Use of a semiconductor device according to the present invention improves performance of the above-mentioned devices. For example, the operation speed is enhanced, and the image resolution is increased. The present invention is applicable widely to the entire field of semiconductor fabrication, such as formation of a bipolar transistor and a static induction transistor using a crystalline semiconductor material, in addition to formation of a MOS transistor described above.

According to the present invention, as has been described in detail, use of a catalytic element such as nickel and two-step annealing realizes formation of two types of TFTs having different electric properties on the same single substrate formed of glass or the like. Accordingly, a driver monolithic type active matrix LCD is easily produced having an image display section and a peripheral driving circuit on the same single substrate.

Also according to the present invention, only a selected area of an amorphous silicon layer which is first crystallized into a crystalline silicon layer using a catalytic element such as nickel is used to form a TFT for a peripheral driving circuit. By such a method, a TFT for a peripheral driving circuit can be formed of a crystalline silicon layer having a substantially uniform crystal growth direction and a very low density of crystal defects (dislocations). The TFT formed of such a layer has a very high mobility and prevents excessive increase of the "OFF" current. Since no catalytic element is introduced into the display area in which a TFT for a pixel electrode will be formed, the "OFF" current can be maintained at a low level. Introduction of the catalytic element only to a selected area without erroneous introduction to a non-selected area can be performed easily by using a mask or the like. Since the crystal growth direction of the area to which a catalyst is introduced can be adjusted by the patten of the mask, any structure of TFT can be configured easily for a peripheral driving circuit.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device including a first thin film transistor having a first channel layer formed of a first crystalline silicon layer and a second thin film transistor having a second channel layer formed of a second crystalline silicon layer, wherein:

the first crystalline silicon layer and the second crystalline silicon layer are located on a single substrate, wherein a promotion of crystallization in the first crystalline silicon layer is achieved without any catalyst, and the second crystalline silicon layer includes a catalytic element for promoting crystallization, the second crystalline silicon layer having a higher mobility than the mobility of the first crystalline silicon layer and being formed of a lateral growth area obtained as a result of crystal growth in a direction substantially parallel to a surface of the substrate from an area of an amorphous silicon layer including the catalytic element introduced thereto.

2. A semiconductor device according to claim 1, wherein the catalytic element is formed of at least one material selected from the group consisting of nickel, iron, cobalt, palladium, platinum, tin, indium, aluminum, gold, silver, antimony, copper, arsenic, and phosphorus.

3. A semiconductor device according to claim 1, wherein the catalytic element is formed of at least one material selected from the group consisting of nickel, iron, cobalt, palladium, platinum, tin, indium, aluminum, gold, silver, antimony, copper, arsenic, and phosphorus.

4. A liquid crystal display device including:

a display section including a liquid crystal layer, a pair of substrates interposing the liquid crystal layer, a plurality of pixel electrodes located in a matrix on a first one of the pair of substrates, and a plurality of first thin film transistors respectively connected to the plurality of pixel electrodes, and a peripheral driving circuit located for driving the display section, the peripheral driving circuit being located on the first one of the pair of substrates and having a second thin film transistor, wherein:

each of the first thin film transistors includes a first channel layer formed of a first crystalline silicon layer, wherein a promotion of crystallization in the first crystalline silicon layer is achieved without any catalyst, and the second thin film transistor includes a second channel layer formed of a second crystalline silicon layer having a higher mobility than the mobility of the first crystalline silicon layer, and the second crystalline silicon layer includes a catalytic element for promoting crystallization and is formed of a lateral growth area obtained as a result of crystal growth in a direction substantially parallel to a surface of the first one of the pair of substrates from a selected area of an amorphous silicon layer including the catalytic element introduced thereto.

5. A liquid crystal display device according to claim 4, wherein the second thin film transistor is located so as to move carriers substantially in the direction of crystal growth.

6. A liquid crystal display device according to claim 5, wherein the catalytic element is formed of at least one material selected from the group consisting of nickel, iron, cobalt, palladium, platinum, tin, indium, aluminum, gold, silver, antimony, copper, arsenic, and phosphorus.

7. A liquid crystal display device according to claim 4, wherein the second crystalline silicon layer is formed as a result of crystallization performed at a temperature of less than 600° C., and the first crystalline silicon layer is formed as a result of crystallization performed at a temperature of no less than 600° C.

8. A liquid crystal display device according to claim 7, wherein the catalytic element is formed of at least one material selected from the group consisting of nickel, iron, cobalt, palladium, platinum, tin, indium, aluminum, gold, silver, antimony, copper, arsenic, and phosphorus.

9. A liquid crystal display device according to claim 4, wherein the catalytic element is formed of at least one material selected from the group consisting of nickel, iron, cobalt, palladium, platinum, tin, indium, aluminum, gold, silver, antimony, copper, arsenic, and phosphorus.

10. A liquid crystal display device according to claim 4, wherein the catalytic element is formed of at least one material selected from the group consisting of nickel, iron, cobalt, palladium, platinum, tin, indium, aluminum, gold, silver, antimony, copper, arsenic, and phosphorus.

11. A liquid crystal display device according to claim 4, wherein the catalytic element is introduced to the amorphous silicon layer used to form the second crystalline silicon layer at a concentration of no greater than $5.0 \times 10^{13}$ atoms/cm$^2$.

* * * * *